(12) United States Patent
Semond et al.

(10) Patent No.: US 10,522,346 B2
(45) Date of Patent: *Dec. 31, 2019

(54) PRODUCTION OF A SEMICONDUCTOR SUPPORT BASED ON GROUP III NITRIDES

(71) Applicant: CENTRE NATIONAL DE LA RECHERCHE SCIENTIFIQUE (CNRS), Paris (FR)

(72) Inventors: Fabrice Semond, Cannes (FR); Eric Frayssinet, Mouans Sartoux (FR); Jean Massies, Valbonne (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/545,288

(22) PCT Filed: Jan. 21, 2016

(86) PCT No.: PCT/FR2016/050126
§ 371 (c)(1),
(2) Date: Jul. 20, 2017

(87) PCT Pub. No.: WO2016/116715
PCT Pub. Date: Jul. 28, 2016

(65) Prior Publication Data
US 2018/0019120 A1    Jan. 18, 2018

(30) Foreign Application Priority Data

Jan. 21, 2015 (FR) ...................................... 15 50462

(51) Int. Cl.
*H01L 21/02* (2006.01)
*H01L 29/778* (2006.01)
(Continued)

(52) U.S. Cl.
CPC .... *H01L 21/02505* (2013.01); *H01L 21/0245* (2013.01); *H01L 21/0254* (2013.01);
(Continued)

(58) Field of Classification Search
None
See application file for complete search history.

(56) References Cited

U.S. PATENT DOCUMENTS 7,645,622 B2 * 1/2010 Fudeta ................... B82Y 20/00
257/E21.001
2002/0069816 A1 * 6/2002 Gehrke ................... C30B 25/02
117/84

(Continued)

FOREIGN PATENT DOCUMENTS

DE    10151092 A1    5/2003
WO    2007/133603 A2    11/2007

OTHER PUBLICATIONS

Derluyn J et al; Journal of Applied Physics; vol. 98, No. 5, pp. 054501-1-054501-5; Sep. 2, 2005; XP012078530 (JAP98)*

(Continued)

*Primary Examiner* — Telly D Green
(74) *Attorney, Agent, or Firm* — Baker & Hostetler LLP

(57) ABSTRACT

The invention relates to a method for producing a support for the production of a semiconductor structure based on group III nitrides, characterised in that the method comprises the steps of:
formation (100) of a buffer layer (20) on a substrate (10), said buffer layer comprising an upper surface layer based on group III nitrides,
and deposition (200) of a crystalline layer (30) on the buffer layer, said crystalline layer being deposited from silicon atoms so as to cover the entire surface of the upper layer based on group III nitrides.

(Continued)

The invention also relates to a support obtained by the method, to a semiconductor structure based on the support, and to the method for the production thereof.

28 Claims, 5 Drawing Sheets

(51) Int. Cl.
 *H01L 33/00* (2010.01)
 *H01L 33/06* (2010.01)
 *H01L 33/32* (2010.01)

(52) U.S. Cl.
 CPC .. *H01L 21/02458* (2013.01); *H01L 21/02516* (2013.01); *H01L 21/02532* (2013.01); *H01L 21/02609* (2013.01); *H01L 21/02631* (2013.01); *H01L 29/778* (2013.01); *H01L 33/007* (2013.01); *H01L 33/06* (2013.01); *H01L 33/32* (2013.01)

(56) References Cited

U.S. PATENT DOCUMENTS

| | | | |
|---|---|---|---|
| 2002/0069817 | A1 | 6/2002 | Mishra et al. |
| 2004/0137732 | A1 | 7/2004 | Frayssinet et al. |
| 2006/0240584 | A1* | 10/2006 | Fudeta .................. B82Y 20/00 438/22 |
| 2012/0091467 | A1 | 4/2012 | Chakraborty et al. |
| 2013/0178050 | A1 | 7/2013 | Kim et al. |

OTHER PUBLICATIONS

Non-Final Rejection of U.S. Appl. No. 15/545,289, filed Aug. 31, 2018.*

Yun et al., "Efficacy of single and double SiNx interlayers on defect reduction in GaN overlayers grown by organometallic vapor-phase epitaxy", Journal of Applied Physics, vol. 98, 2005, pp. 123502-1-123502-8.

Tanaka et al., "Anti-Surfactant in III-Nitride Epitaxy-Quantum Dot Formation and Dislocation Termination", Japanese Journal of Applied Physics, vol. 39, Part 2, No. 8B, Aug. 15, 2000, pp. L831-L834.

Sakai et al., "A new method of reducing dislocation density in GaN layer grown on sapphire substrate by MOVPE", Journal of Crystal Growth, vol. 221, 2000, pp. 334-337.

Preliminary Research Report received for French Application No. 1550462, dated Oct. 8, 2015, 4 pages (1 page of French Translation Cover Sheet and 3 page of original document).

Markurt et al., "Blocking Growth by an Electrically Active Subsurface Layer: The Effect of Si as an Antisurfactant in the Growth of GaN" Physical Review Letters, vol. 110, 2013, pp. 036103-1-036103-5.

Kappers et al., "Threading dislocation reduction in (0001) GaN thin films using SiNx interlayers", Journal of Crystal Growth, vol. 300, Issue 1, Mar. 2007, pp. 70-74.

Jung et al., "Novel Epitaxial Nanostructures for the Improvement of InGaN LEDs Efficiency", IEEE Journal of Selected Topics in Quantum Electronics, vol. 15, Issue 4, Jul.-Aug. 2009, pp. 1073-1079.

International Search Report and Written Opinion received for PCT Patent Application No. PCT/FR2016/050126, dated May 3, 2016, 20 pages (9 pages of English Translation and 11 pages of Original Document).

International Preliminary Report on Patentability received for PCT Patent Application No. PCT/FR2016/050126, dated Aug. 3, 2017, 16 pages (8 pages of English Translation and 8 pages of Original Document).

* cited by examiner

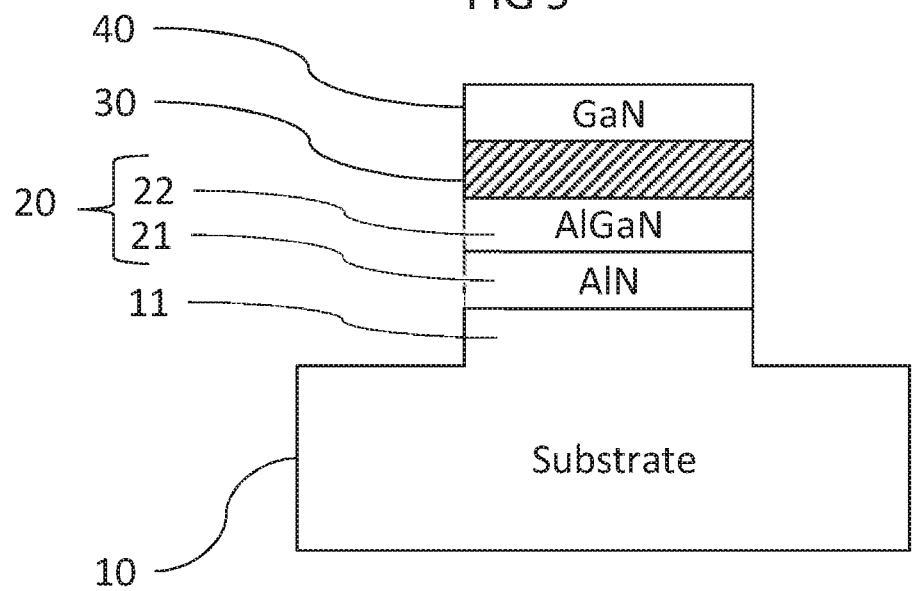
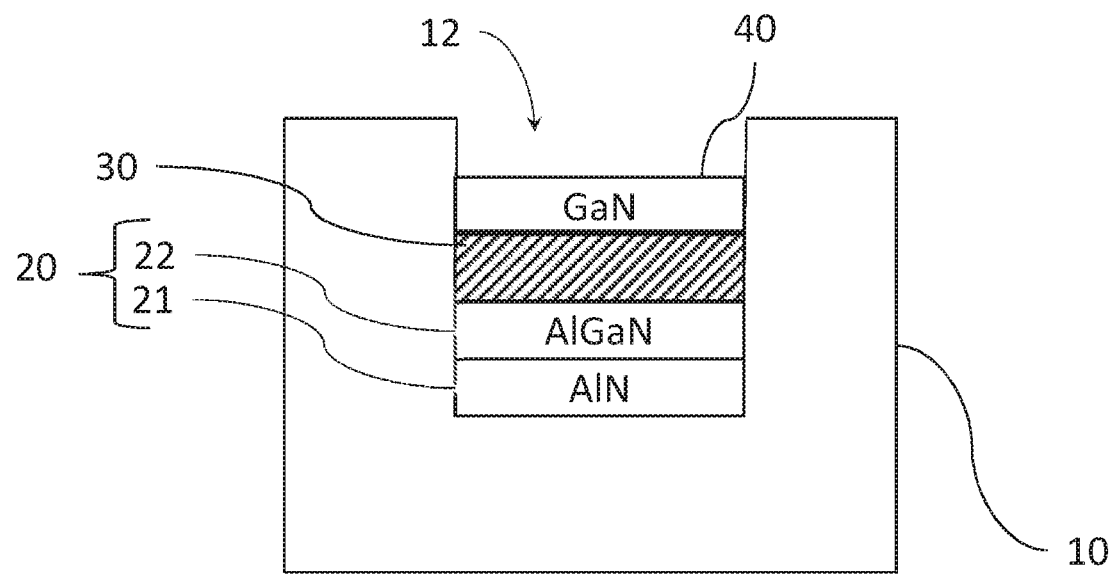

PRODUCTION OF A SEMICONDUCTOR SUPPORT BASED ON GROUP III NITRIDES

FIELD OF THE INVENTION

The invention relates to a method for producing a semiconductor structure based on group III nitrides and such a semiconductor structure.

PRESENTATION OF THE PRIOR ART

Semiconductor materials based on group III nitrides of the periodic table—such as materials based on gallium nitride GaN—occupy an increasingly important place in the electronics and optoelectronics fields, notably for the production of light emitting diodes.

Existing methods for producing a semiconductor structure based on group III nitrides, such as gallium nitride GaN, on a substrate, for example made of silicon or sapphire, generally result in an important threading dislocation density linked to the difference in lattice parameter between the host substrate and the semiconductor materials based on group III nitrides. These threading dislocations are particularly disadvantageous in the case of semiconductor structures forming light emitting devices based on semiconductor materials of group III nitrides since threading dislocations increase leakage currents and deteriorate the luminescence output of these light emitting devices.

Three dimensional epitaxy techniques—such as ELO (epitaxial lateral overgrowth), pendeo-epitaxy from nanopillars, the addition of antisurfactant species, the modification of the growth conditions—have proven their efficiency in reducing the threading dislocation density in semiconductor materials based on group III nitrides. The approach used by these techniques for reducing the threading dislocation density consists of initiating a mode of three-dimensional growth (by islands), then favouring the coalescence of the islands to obtain a two-dimensional gallium nitride GaN layer.

A popular in-situ technique for reducing the threading dislocation density consists of inserting an intercalary silicon nitride SiNx layer below the GaN layer. More precisely, a silicon nitride SiNx layer is deposited in-situ on a group III nitride layer, then a gallium nitride GaN layer is deposited on the silicon nitride SiNx layer. This technique has proven its efficiency in reducing the threading dislocation density for conventional c-plane GaN but also for semi non-polar orientations.

It is known that a surface treatment based on silicon and ammonia leads to the formation of a nanoporous silicon nitride SiNx layer which acts as a nano-mask making it possible to initiate a three-dimensional mode of growth of GaN. The growth of GaN is inhibited in the regions where the silicon nitride SiNx is located. On the other hand the growth takes place in the nano-pores, that is to say in the openings of the nano-mask. The density and the size of the latter are controlled by the deposition time of the silicon nitride SiNx and their distribution on the surface is random.

For examples, the following documents deal with these subjects:

The article entitled "A New Method of Reducing Dislocation Density in GaN Layer Grown on Sapphire Substrate by MOVPE" by Sakai et al., J. Cryst. Growth, 221, 334 (2000), The article entitled "Anti-Surfactant in III-Nitride Epitaxy—Quantum Dot Formation and Dislocation Termination" by S. Tanaka et al., Jap. J. Appl. Phys., 39, L83 1 (2000), The article "Efficacy of single and double $SiN_x$ interlayers on defect reduction in GaN overlayers grown by organometallic vapor-phase epitaxy", by F. Yun et al., J. Appl. Phys., 98, 123502 (2005), The patent application DE10151092 A1, The patent application WO2007/133603 A2.

For example, the document US 2004/0137732 proposes depositing on a substrate a film of silicon nitride fulfilling a function of mask having discontinuities or openings, then carrying out the deposition of a thin gallium nitride layer at low temperature before carrying out a thermal annealing. The annealing makes it possible to localise the gallium nitride at the level of the openings of the mask in order to obtain islands of gallium nitride that a later growth of gallium nitride exploits.

It has recently been shown that this type of treatment could also lead to the formation of a crystalline structure noted $3^{1/2} \times 3^{1/2}$ R30°, notably in the article "Blocking Growth by Electrically Active Subsurface Layer: The Effects of Si as an Antisurfactant in the Growth of GaN", by T. Markurt et al. Physical Review Letters 110, 036103 (2013). In this article, the crystalline layer is produced so as to obtain a partially covered surface, with more or less large uncovered regions that are called "openings" and this layer is designated "nanoporous".

During the step of deposition of the gallium nitride GaN layer, the epitaxied gallium nitride grows preferentially in the openings of the nanoporous layer so as to form islands. Once the islands have been formed, the growth parameters are adjusted so that the gallium nitride GaN develops laterally so as to cover the zones covered with SiNx, and coalesces in order to form a gallium nitride GaN layer (3D growth). The growth of the gallium nitride layer is next continued until a desired thickness of gallium nitride GaN is obtained (2D growth). The coalescence thickness of the gallium nitride GaN is defined as the thickness required to obtain a GaN layer entirely coalesced after the insertion of the SiNx layer.

The reader will have understood that the increase in the duration of the surface treatment, and thus of the quantity of SiNx deposited, has the effect of increasing the coverage level of the SiNx layer and thus decreasing the density of gallium nitride GaN islands, which makes it possible to reduce the threading dislocation density. On the other hand, the lower the density of gallium nitride GaN islands, the greater the thickness of gallium nitride GaN required to obtain coalescence. It is thus particularly advantageous to determine the optimum coverage level of the SiNx layer in order to make such a method exploitable industrially.

In addition, existing methods for producing devices based on GaN on a substrate generally comprise a first step of deposition of a buffer layer, which may be for example aluminium nitride AlN for a silicon substrate potentially followed by a step of deposition of an aluminium and gallium nitride AlGaN layer on the aluminium nitride AlN buffer layer. The nano-mask may next be deposited on the AlN or AlGaN layer. Other methods provide for using a sapphire substrate and depositing a GaN layer at low temperature as buffer layer, in which case the nano-mask is deposited on the GaN buffer layer.

A drawback of the mentioned growth technique with the nano-mask of SiNx relates to the fact that oxidation reactions may take place at the surface of the buffer layer not covered by the SiNx layer. Notably, the buffer layer can oxidise at the level of the openings in the case of exposure to air of the support constituted of the substrate, the buffer layer and the SiNx layer. Consequently, in the methods of the prior art, the upper (or final) gallium nitride GaN layer is formed on the SiNx layer immediately after the formation thereof, without possibilities of storage of the support prior to the deposition of a gallium nitride layer thereon.

Another drawback of this technique relates to the fact that no means exist making it possible to define the optimal duration of the step of deposition of the nanoporous SiNx layer. This optimal duration, linked to the size of the openings and the density thereof, varies as a function of the starting substrate used for the growth, the type of reactor used for the growth, and other parameters such as the concentrations of gaseous precursors, etc. The size of the openings and the density thereof are non-measurable quantities, thus the determination of the optimal duration of the step of deposition of the nanoporous SiNx layer may thus only be obtained in an empirical manner by carrying out successive tests, which have to be reiterated each time that one of the growth parameters (i.e. substrate, reactor, etc.) is modified, which is time consuming and especially does not make it possible to carry out a generic method, that is to say applicable in a general manner.

An aim of the present invention is to propose a method making it possible to overcome at least one of the aforementioned drawbacks.

SUMMARY OF THE INVENTION

In this respect, the invention proposes a method for producing a support for the production of a semiconductor structure based on group III nitrides, characterised in that the method comprises the steps of:
  formation of a buffer layer on a substrate, said buffer layer comprising an upper layer based on group III nitrides,
  deposition of a crystalline layer on the buffer layer, said crystalline layer being deposited from silicon atoms so as to cover the entire surface of the upper layer based on group III nitrides, said crystalline layer having a triple periodicity of silicon atoms in the crystallographic direction [1-100] such that a diffraction image of said crystalline layer obtained by grazing-incidence diffraction of electrons in the direction [1-100] comprises:
  a central line (0, 0) and integer order lines (0, −1) and (0, 1),
  two fractional order diffraction lines (0, −⅓) and (0, −⅔) between the central line (0, 0) and the integer order line (0, −1), and
  two fractional order diffraction lines (0, ⅓) and (0, ⅔) between the central line (0, 0) and the integer order line (0, 1).

The fact of depositing a crystalline layer that covers the entire surface of the buffer layer on the substrate makes it possible to passivate totally the surface of the buffer layer and thus to prevent any oxidation reaction of the latter. This enables the storage of the support composed of the substrate, the buffer layer and the crystalline layer prior to the deposition of the semiconductor structure based on group III nitrides.

The step of deposition of a crystalline layer that covers the entire surface further makes it possible to do without the empirical phases of development and optimisation of methods of the prior art based on a step of deposition of a nanoporous SiNx layer, notably the determination of the optimum size of the nanopores as well as the optimum density of the nanopores.

The step of deposition of a crystalline layer based on silicon further enables a later growth of a layer based on group III nitride thereon, whereas an amorphous nanoporous layer covering the upper layer based on group III nitride would not enable this later growth. The described diffraction image corresponds to a hexagonal periodical arrangement turned by 30° with respect to the lattice of the layer based on group III nitride and of lattice parameter $\sqrt{3}$ times greater than the lattice parameter of the lattice of the layer based on group III nitride, which makes it possible to favour this later growth of a crystalline layer.

It will be understood hereafter that when a layer A is mentioned as being on a layer B, this may be directly on the layer B, or may be situated above the layer B and separated from said layer B by one or more intermediate layers.

It will also be understood that when a layer A is mentioned as being on a layer B, said layer may cover the entire surface of the layer B, or a portion of said layer B.

Preferably, the step of deposition of the crystalline layer is interrupted at an instant corresponding to a maximum of luminous intensity of the intermediate fractional order lines of the diffraction image in the crystallographic direction [1-100].

Preferred but non-limiting aspects of the device according to the invention are the following:
  the crystalline layer is in epitaxial relation with the group III nitride layer;
  the crystalline layer is deposited from silicon atoms and nitrogen atoms, for example provided by ammonia;
  the crystalline layer has a single periodicity in the crystallographic direction [1-210] such that a diffraction image of said crystalline layer obtained by grazing-incidence diffraction of electrons in the direction [1-210] comprises a central line (0, 0) and integer order lines (0, −1) and (0, 1) without fractional order lines between them;
  the substrate is based on silicon and the step of formation of the buffer layer includes the deposition of an aluminium nitride AlN layer forming the upper surface layer based on group III nitrides;
  the substrate is based on silicon and the step of formation of the buffer layer includes:
    the deposition of an aluminium nitride AlN layer, and
    the deposition of a gallium and aluminium nitride AlGaN layer forming the upper surface layer based on group III nitrides on the aluminium nitride AlN layer;
  the buffer layer has, at the end of the formation thereof, a thickness comprised between 10 and 200 nm;
  the step of deposition of the crystalline layer consists of an ultra-vacuum deposition;
  the step of deposition of the crystalline layer consists of a deposition by molecular beam epitaxy;
  the method comprises a step of measuring the crystalline layer by grazing-incidence diffraction of electrons in the crystallographic direction [1-100] during the step of deposition of the crystalline layer so as to obtain a diffraction image of said crystalline layer, and the duration of the step of deposition of the crystalline layer is a function of the intensity of at least one diffraction line of the diffraction image of the crystalline layer in the crystallographic direction [1-100];

the diffraction image of the crystalline layer in the crystallographic direction [1-100] comprises:
  a central line (0, 0) and integer order lines (0, −1) and (0, 1),
  two fractional order diffraction lines (0, −⅓) and (0, −⅔) between the central line (0, 0) and the integer order line (0, −1), and
  two fractional order diffraction lines (0, ⅓) and (0, ⅔) between the central line (0, 0) and the integer order line (0, 1);
  the step of deposition of the crystalline layer being interrupted when the luminous intensity of said fractional order lines is maximal;
the step of deposition of the crystalline layer consists of a vapour phase deposition;
the step of deposition of the crystalline layer consists of a deposition by metal organic vapour phase epitaxy;
the crystalline layer is deposited from silicon atoms and ammonia molecules.

The invention also relates to a support for the production of a semiconductor structure based on group III nitrides, characterised in that it comprises:
  a substrate,
  a buffer layer on the substrate, the buffer layer comprising an upper layer based on group III nitrides,
  a crystalline layer on the buffer layer, said crystalline layer including silicon atoms and covering the entire surface of the upper layer based on group III nitrides of the buffer layer, said crystalline layer having a triple periodicity of silicon atoms in the direction [1-100], such that a diffraction image of said crystalline layer obtained by grazing-incidence diffraction of electrons in the direction [1-100] comprises:
    a central line (0, 0) and integer order lines (0, −1) and (0, 1),
    two fractional order diffraction lines (0, −⅓) and (0, −⅔) between the central line (0, 0) and the integer order line (0, −1), and
    two fractional order diffraction lines (0, ⅓) and (0, ⅔) between the central line (0, 0) and the integer order line (0, 1).

Preferably, the state of the crystalline layer, in particular its level of coverage of the underlying surface, i.e. the surface of the buffer layer, corresponds to a maximum of luminous intensity of the intermediate fractional order lines of the diffraction image in the crystallographic direction [1-100].

Preferred but non-limiting aspects of the support according to the invention are the following:
  the crystalline layer is in epitaxial relation with the group III nitride layer;
  the crystalline layer also includes nitrogen atoms;
  the crystalline layer has a single periodicity in the crystallographic direction [1-210] such that a diffraction image of said crystalline layer obtained by grazing-incidence diffraction of electrons in the direction [1-210] comprises a central line (0, 0) and integer order lines (0, −1) and (0, 1) without fractional order lines between them;
  the substrate is based on sapphire $Al_2O_3$, silicon Si, silicon on insulator SOI, silicon carbide SiC, aluminium nitride AlN, zinc oxide ZnO or gallium arsenide GaAs;
  the substrate is based on silicon and the buffer layer comprises an aluminium nitride AlN layer and a gallium and aluminium nitride AlGaN layer on the aluminium nitride AlN layer;
  the crystalline layer has a thickness comprised between 2 Å and 6 Å;
  the buffer layer has a thickness comprised between 10 and 200 nm.

The invention also relates to a method for producing a semiconductor structure based on group III nitrides, comprising the steps of:
  supply of a support according to the invention,
  growth of a semiconductor structure based on group III nitrides on the crystalline layer.

Preferably, the step of growth is carried out at a temperature comprised between 950 and 1200° C., and preferably between 1000° C. and 1100° C. Preferably also, the step of growth does not comprise an annealing step. Again preferably, the step of growth comprises the growth of a layer based on group III nitrides on the crystalline layer having a thickness greater than 1 µm, and preferably greater than 2 µm.

Preferably, the step of growth comprises a step of deposition of a gallium nitride GaN layer on the crystalline layer. Preferably, the step of growth consists of a deposition by metal organic vapour phase epitaxy.

The invention also relates to a semiconductor structure based on group III nitrides, comprising:
  a support according to the invention,
  a semiconductor material based on group III nitrides on the crystalline layer.

Preferably, the semiconductor material based on group III nitrides on the crystalline layer comprises a gallium nitride layer. Gallium nitride GaN has a threading dislocation density less than or equal to $5.10^8$ cm$^{-2}$. Preferably, the semiconductor material based on group III nitrides on the crystalline layer comprises an aluminium based layer.

The invention also relates to a light emitting diode based on group III nitrides, characterised in that it comprises:
  a semiconductor structure according to the invention,
  a first contact layer based on gallium nitride arranged on the first semiconductor layer based on group III nitrides,
  a second contact layer based on gallium nitride arranged on the first contact layer based on gallium nitride,
  an active layer provided with a structure of multiple quantum wells arranged between the first contact layer based on gallium nitride and the second contact layer based on gallium nitride.

BRIEF DESCRIPTION OF THE DRAWINGS

Other advantages and characteristics of the method according to the invention and the associated product will become clearer from the description that follows of several alternative embodiments, given as non-limiting examples, and from the appended drawings in which:
FIG. 5 illustrates a semiconductor structure having a mesa structure;
FIG. 6 illustrates a semiconductor structure having a box structure.

In the different figures, the same references designate similar elements.

DETAILED DESCRIPTION OF THE INVENTION

The method according to the invention will now be described in greater detail with reference to the growth of a gallium nitride GaN layer on a support, making it possible to produce light emitting diodes. The layer based on group III nitrides may be a thick layer (or "template") or self-supporting layer, also designated bulk substrate. The semiconductor structure based on group III nitride may thus be a thick layer of GaN, AlN, etc., or a bulk substrate of GaN, AlN etc., or instead an epitaxied structure (or "epiwafer").

Nevertheless, it is obvious to those skilled in the art that the method described hereafter may be used to make grow a material based on group III nitrides other than gallium nitride, this material being able to be used to produce other semiconductor structures than light emitting diodes. For example, the structure obtained may thus have a configuration of light emitting diode, or high electron mobility transistor (HEMT).

Figure 1:
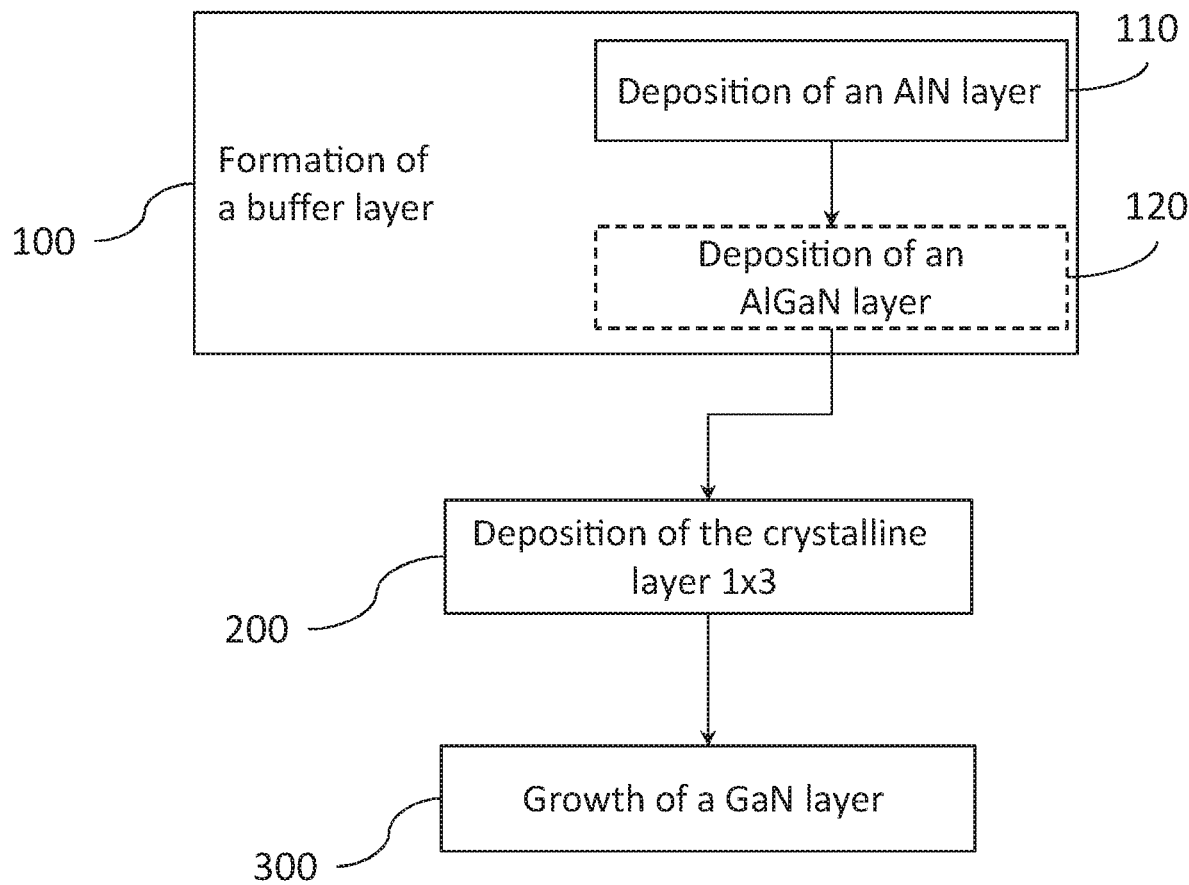
FIG. 1 illustrates an example of method for producing a semiconductor structure based on group III nitrides.
Figure 2:
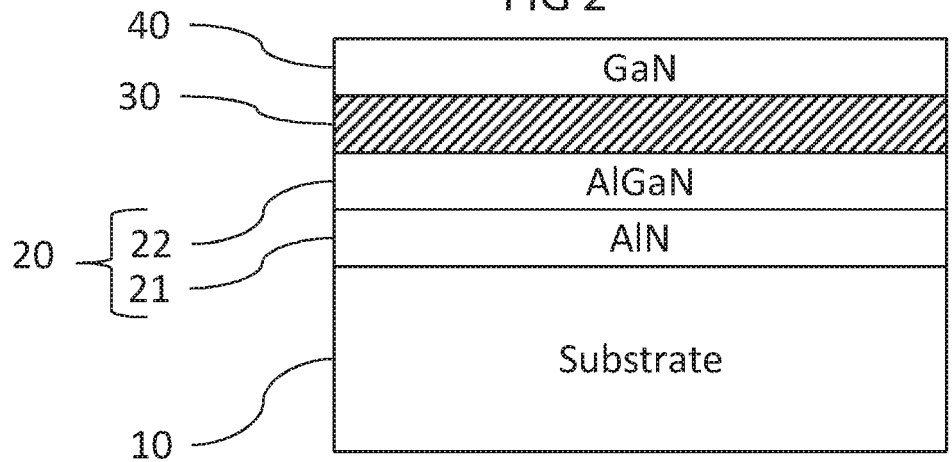
FIG. 2 schematically illustrates an example of product obtained by implementing the method illustrated in FIG. 1,
  FIGS. 3 and 4 illustrate two diffraction images in the crystallographic directions [1-100] and [1-210], respectively, of a crystalline layer according to the invention.

In FIG. 1 is illustrated an alternative embodiment of the method according to the invention. The method comprises the steps consisting of:
- forming 100 a buffer layer on a substrate, said buffer layer comprising an upper surface layer based on group III nitrides,
- depositing 200 a crystalline layer on the buffer layer,
- making 300 a gallium nitride layer grow on the crystalline layer, said crystalline layer being deposited from silicon atoms.

Substrate

To produce the semiconductor structure, a substrate 10 is used on which different deposition steps are implemented.

The substrate 10 used may be sapphire $Al_2O_3$, silicon Si, silicon carbide SiC, aluminium nitride AlN, zinc oxide ZnO or gallium arsenide GaAs. In one embodiment, the substrate is silicon.

The use of a silicon substrate has numerous advantages compared to the use of a sapphire substrate; notably:
- a silicon substrate is cheaper than a sapphire substrate;
- the dimensions of silicon substrates (generally up to 12 inches, i.e. 30.48 cm) are greater than those of sapphire substrates (generally up to 6 inches, i.e. 15.24 cm); it is thus possible to produce a gallium nitride GaN layer of larger surface area using a silicon substrate;
- the different post-growth steps of production of components (polishing rear face, transfer front face, removal of the substrate, etc.) after the growth of the gallium nitride GaN layer are simpler and cheaper in the case of the use of a silicon substrate than in the case of a sapphire substrate.

Thus, the use of silicon substrates enables for example the production of light emitting diodes (LED) at low production cost, which may be particularly advantageous in the lighting field.

Advantageously, the substrate 10 may be a patterned substrate comprising a mesa structure 11 having the shape of a raised plateau (the size of which may vary from 10×10 µm to 400×400 µm) and obtained by etching of the surface of the substrate surrounding the plateau, as illustrated in FIG. 5, or instead a box structure, as represented in FIG. 6, in which the buffer layer 20 based on group III nitride, in this particular case made of AlN and AlGaN, the crystalline layer 30 covering it entirely and the gallium nitride layer 40 are situated in a recess 12 cut into the substrate 10. Another method for producing patterns, such as for example the partial masking of the surface by a mask made of dielectric materials, may be advantageously used.

The use of such a patterned substrate makes it possible to limit fissuring of the gallium nitride layer 40 epitaxied on the substrate 10, and thus to increase the critical thickness of gallium nitride GaN that can be deposited on the substrate 10 without creating fissures.

For example, it is possible to produce a non-fissured gallium nitride GaN layer of 5 µm thickness using a substrate including a mesa structure of 200×200 µm whereas the use of a non-structured substrate only makes it possible to produce a non-fissured gallium nitride GaN layer of 1 µm thickness.

Formation of the Buffer Layer

The method comprises a step of formation 100 of a buffer layer 20 comprising an upper surface layer based on group III nitrides. This buffer layer may for example comprise a layer of aluminium nitride AlN, aluminium gallium nitride AlGaN, aluminium gallium boron nitride AlGaBN, a stack of AlN/AlGaN, a gradual AlGaN, zinc oxide ZnO, or instead boron nitride BN or instead silicon carbide SiC. However, in all cases, the buffer layer has an upper layer based on group III nitrides, such as aluminium nitride AlN, aluminium gallium nitride AlGaN.

In the case of the example of the present description, this step of formation 100 comprises the deposition 110 of an aluminium nitride AlN layer 21 on the substrate 10. This aluminium nitride AlN layer 21 may constitute the upper surface layer based on group III nitrides of the buffer layer 20.

The formation of a buffer layer 20 including an aluminium nitride AlN layer 21 makes it possible to improve the quality of the gallium nitride GaN layer 40 deposited later.

For example, when the substrate 10 used is silicon Si, the direct growth of gallium nitride GaN on silicon Si is very difficult notably on account of the high chemical reactivity between gallium Ga and silicon Si at high temperature.

The formation of a buffer layer 20 including an aluminium nitride AlN layer 21 makes it possible to overcome these difficulties, and thus to improve the quality of the epitaxied gallium nitride GaN layer 40.

The buffer layer 20 may have a thickness comprised between 10 nm and 500 nm, preferentially between 10 µm and 200 nm. A buffer layer with a thickness greater than 200 nm makes it possible to obtain a good crystalline quality of the buffer layer 20, and thus to improve that of the group III nitride layer epitaxied later.

The crystalline layer according to the invention, which totally covers the buffer layer, makes it possible however to ensure a good crystalline quality of the group III nitride layer epitaxied later even if the crystalline quality of the buffer layer is not maximal. Consequently, it is not necessary that the buffer layer 20 reaches a thickness greater than 200 nm. Thus, preferably, the buffer layer 20 has a thickness comprised between 10 and 200 nm, or even between 50 and 100 nm.

The fact of limiting the thickness of the buffer layer 20 below 200 nm advantageously makes it possible to reduce the duration of the method, the growth time of an aluminium nitride AlN layer 21 being relatively long. Another advantage is the fact that with a not very thick buffer layer 20, which is entirely covered by a crystalline layer, the problem of dislocations in this buffer layer resolved by the crystalline layer 30 is all the more rapidly resolved, which prevents dislocations from propagating and causing dislocations.

The step of formation 100 of the buffer layer 20 may also comprise an optional step of deposition 120 of an aluminium and gallium nitride AlGaN layer 22 on the aluminium nitride AlN layer 21. This aluminium and gallium nitride AlGaN layer 22 then forms the upper surface layer based on group III nitride of the buffer layer 20.

This makes it possible to obtain a complex buffer layer 20 of aluminium nitride AlN and aluminium and gallium nitride AlGaN.

The aluminium and gallium nitride AlGaN layer 22 makes it possible to reduce the threading dislocation density of the layer on which the crystalline layer is deposited.

Advantageously, the thickness of the buffer layer, and thus potentially the sum of the thicknesses of the layers 21, 22 of aluminium nitride AlN and of aluminium and gallium nitride AlGaN may be comprised between 10 nm and 500 nm, preferably between 50 and 200 nm with for example the following distribution:

25-100 nm of aluminium nitride AlN,
25-400 nm of aluminium and gallium nitride AlGaN.

This makes it possible to reduce the duration of growth of the buffer layer while benefiting from the advantages relative to the deposition of aluminium nitride and aluminium and gallium nitride layers.

Preferably, the surface of the buffer layer, that is to say the surface of the layer based on group III nitrides, on which is going to be deposited the crystalline layer, is formed as smooth as possible.

To this end, it is advantageous to carry out the surface treatment of the buffer layer 20 at a temperature less than 950° C. under a flow of silicon atoms and a flow of nitrogen atoms, for example molecules of ammonia $NH_3$, in a molecular beam epitaxy reactor. In so doing, the surface does not degrade and remains smooth.

Deposition of a Crystalline Layer

The method also comprises a step of deposition 200 of an epitaxial crystalline layer 30 on the buffer layer 20. The crystalline layer is deposited from a precursor containing silicon Si atoms, and potentially nitrogen atoms. The precursor containing silicon atoms may for example be silane $SiH_4$, disilane $Si_2H_6$, or trimethylsilane $SiH(CH_3)_3$. Nitrogen atoms may be introduced, for example by molecules of ammonia $NH_3$.

The crystalline layer 30 is deposited so as to cover the entire surface of the buffer layer 20, constituted by the upper surface of the layer based on group III nitrides, for example the aluminium nitride layer 21 or the gallium nitride layer 22. The crystalline layer 30 is deposited so as to be in epitaxy with the group III nitride layer, i.e. in epitaxial relation with the group III nitride layer.

The step of deposition of the crystalline layer 30 corresponds to a surface treatment which leads to a surface reconstruction of the atoms deposited on the surface of the buffer layer 20.

In fact, following the exposure of the surface of the buffer layer 20 to the silicon Si atoms and potentially to the molecules of ammonia $NH_3$, silicon Si atoms, and potentially nitrogen, bond to the surface of the buffer layer by creating a hexagonal arrangement turned by 30° compared to the lattice of the layer based on group III nitride on which the atoms are deposited and with a lattice parameter $\sqrt{3}$ times greater than that of the layer based on group III nitride.

The formation of this surface reconstruction is measurable by electron diffraction techniques and it is possible to quantify its level of coverage of the surface by recording the intensity of the specific diffraction lines of this surface reconstruction.

The diffraction of electrons is a technique used for the study of matter, which consists of bombarding a sample with electrons and in observing the resulting diffraction figure.

An example of electron diffraction technique that may be used within the scope of the present invention for studying the structure of the crystalline layer is reflection high energy electron diffraction (RHEED), which is a technique making it possible to determine the crystalline structure of the surface in an ultra-vacuum environment.

The RHEED technique notably makes it possible to determine the surface reconstruction, to measure the rate of growth and to assess qualitatively the flatness of the surface. A RHEED device consists of an electron gun which makes it possible to create a monokinetic beam of electrons of an energy of 10 to 50 keV focused on the surface. The wavelength associated with the electrons is of the order of 0.1 Å. The beam reaches the surface in grazing incidence with an angle of 1 to 2 degrees. In this configuration the interaction of the electrons with the surface is limited to several atomic planes. The electrons reflected and diffracted by the surface atoms are collected on a fluorescent screen, making it possible to visualise the corresponding diffraction pattern and this pattern may next be digitised using a CCD camera. The document "Reflection High Energy Electron Diffraction", by Ayahiko Ichimiya and Philip I. Cohen, Cambridge University Press, 2004, describes this technique.

Figure 3:
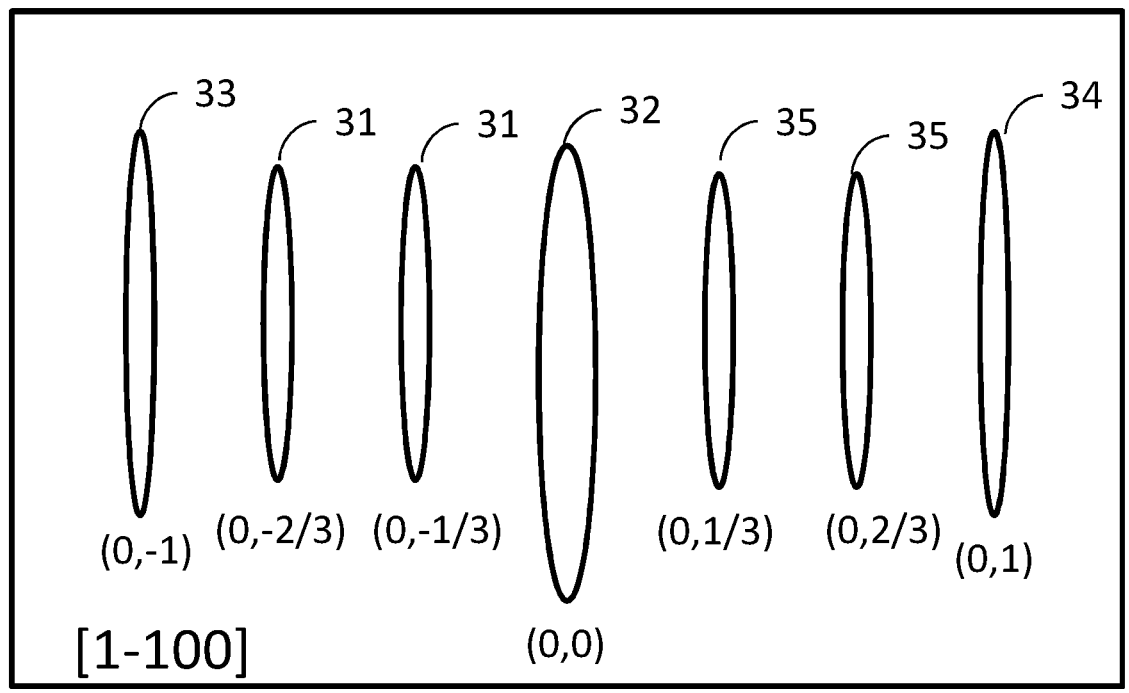
Figure 4:
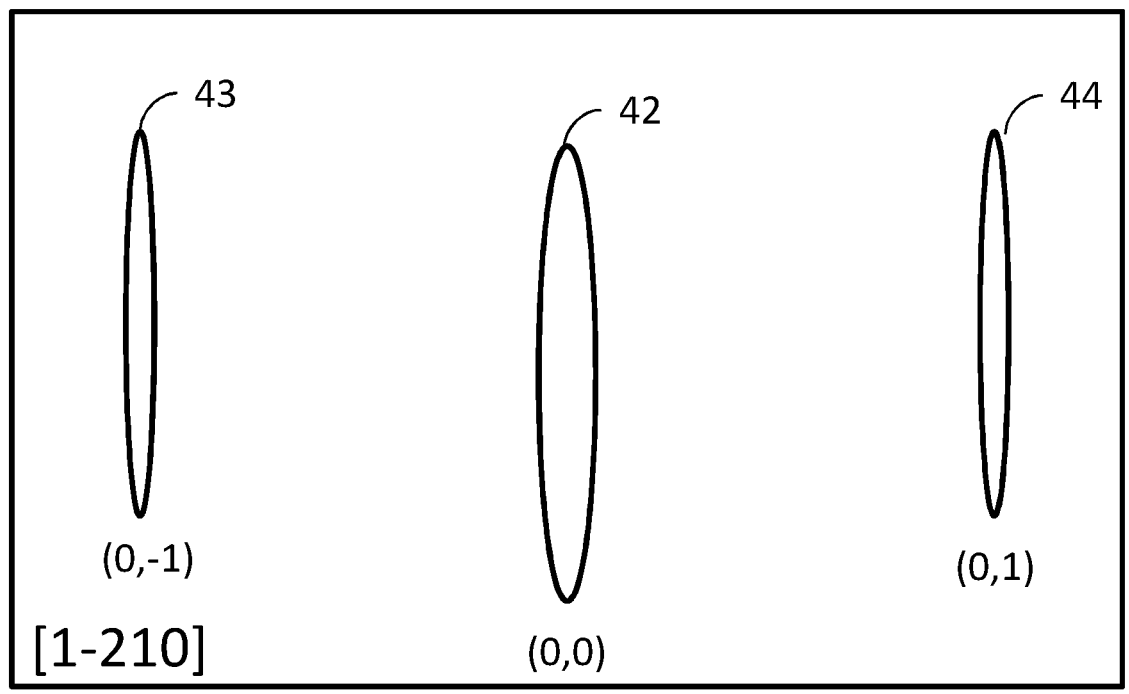

With reference to FIGS. 3 and 4, two diffraction images of the crystalline layer in the respective crystallographic directions [1-100] and [1-210] are illustrated.

In FIG. 4, the diffraction image of the crystalline layer in the direction [1-210] uniquely comprises whole diffraction lines: a central line (0,0) 42 and two integer order lines (0, −1) 43 and (0, 1) 44 on either side of said central line 42. Thus there are no fractional order lines between the integer order lines (0, −1) and (0, 1) and the central line (0, 0). It is to be noted that the gap between the whole diffraction lines is inversely proportional to the lattice parameter in the plane of the surface.

In FIG. 3 on the other hand, corresponding to the diffraction image of the crystalline layer in the direction [1-100], the presence of a surface reconstruction leads to the presence of additional fractional lines, that is to say non-integer order lines, to be specific ⅓ lines characteristic of a reconstruction designated 1×3. The diffraction image of the crystalline layer in the direction [1-100] thus comprises:

a central line (0, 0) and integer order lines (0, −1) and (0, 1),
two fractional order diffraction lines 31, designated (0, −⅓) and (0, −⅔), between the lines (0, 0) 32 and (0, −1) 33, and
two fractional order diffraction lines 35, designated (0, ⅓) and (0, ⅔), between the lines (0, 0) 32 and (0, 1) 34.

Consequently, the diffraction image in the direction [1-210] only has one space between the integer order lines, whereas the diffraction image in the direction [1-100] has three spaces between the integer order lines, which is why this crystalline layer is denoted 1×3.

Thus, and unlike methods of the prior art comprising a step of deposition of a nanoporous $SiN_x$ layer of which the exact structure and composition are unknown, the method according to the invention proposes the deposition of a crystalline layer designated 1×3 of perfectly defined structure and composition, and of which the pore density is preferably the lowest possible, or even substantially zero.

Hence, in methods of the prior art, it is sought to avoid a total coverage level of the surface of the layer based on group III nitride. Yet, the inventors have discovered that the threading dislocation density is minimal when the crystalline layer covers the entire surface of the layer based on group III nitride.

Preferably, the step of deposition 200 of the crystalline layer 30 is thus interrupted at an instant corresponding to a maximum of luminous intensity of the intermediate fractional order lines of a diffraction image in the crystallographic direction [1-100].

Figure 7:
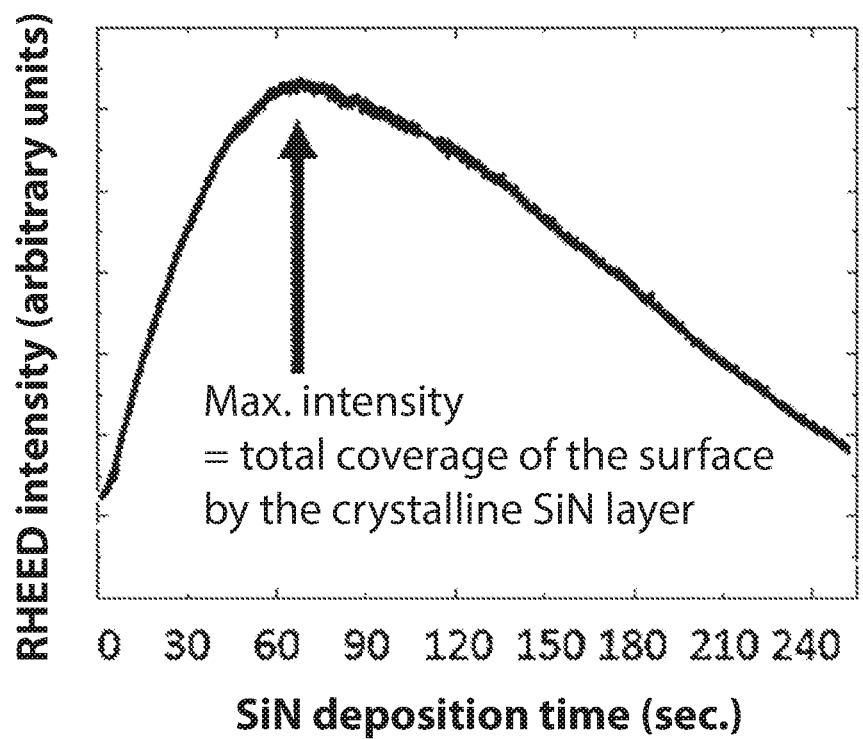
FIG. 7 illustrates a curve representative of the change over time of the intensity of the fractional order lines of a diffraction image during the deposition of a crystalline layer.
Figure 8:
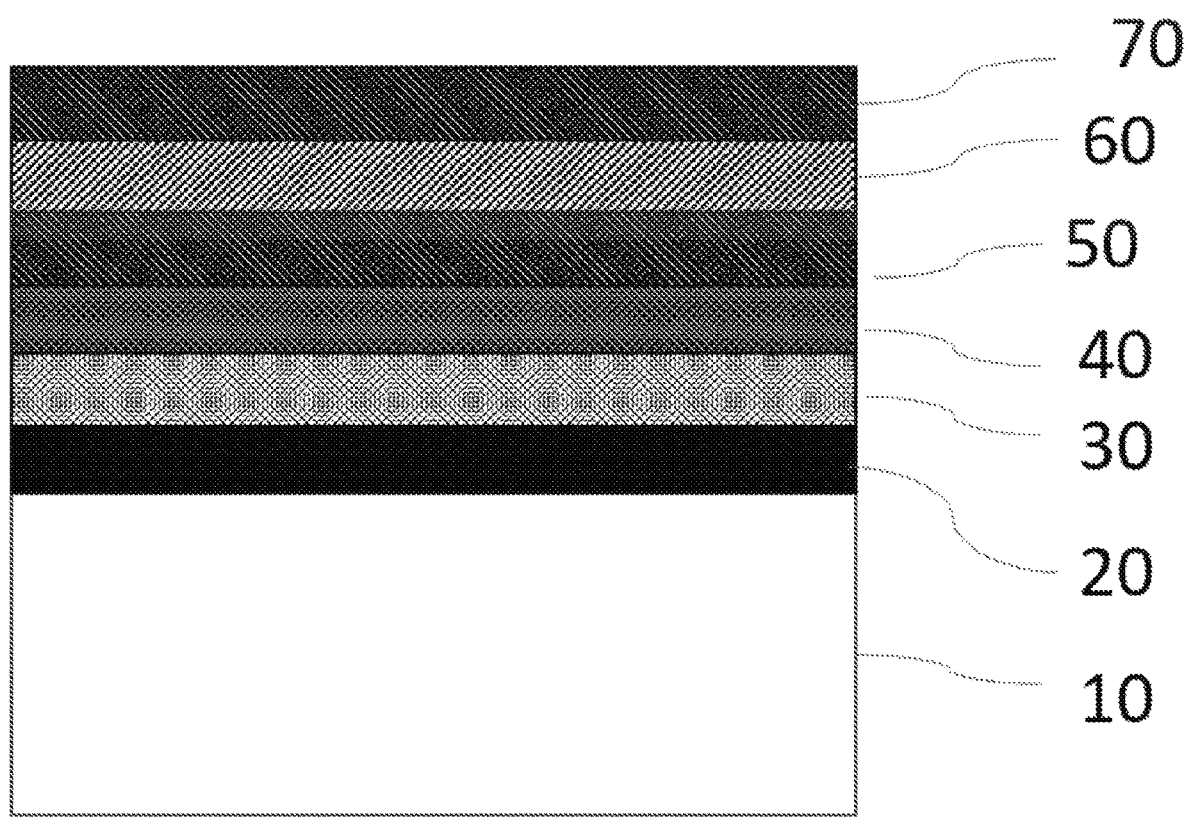
FIG. 8 illustrate another exemplary semiconductor structure.

FIG. 7 thus shows an example of curve representative of the change over time of the intensity of a fractional order line in a diffraction image during the deposition of a crystalline layer. It may be noted that this intensity firstly begins by increasing between 0 and 60 seconds, then decreases after 90 seconds. The level of a maximum of intensity is thus reached between 60 seconds and 90 seconds.

In the deposition conditions of FIG. 7, it is thus possible to interrupt the step of deposition of the crystalline passivation layer at an instant corresponding to a maximum of luminous intensity of the intermediate fractional order lines of a diffraction image in the crystallographic direction [1-100] by interrupting the deposition between 60 and 90 seconds after its start.

It is to be noted that the crystalline layer 1×3 may have a very low thickness, of the order of a monolayer of silicon atoms, i.e. of the order of 2 to 3 Å. Hence, in order to conserve the crystalline character of the crystalline layer 1×3, the thickness thereof is preferably less than 6 Å.

Advantageously, the deposition of the crystalline layer 1×3 induces a passivation of the surface of the buffer layer. This passivation enables the buffer layer to be made inert vis-à-vis exposure to air and thus to prevent any oxidation reaction.

Obtaining a Support for the Growth of Gallium Nitride GaN

At the end of the step of deposition 200 of the crystalline layer 30, a support is obtained for the growth of a semiconductor structure based on group III nitrides, such as a gallium nitride GaN layer.

Since the crystalline layer 30 passivates the surface of the support, it is possible to remove said support from the reactor in which the crystalline layer 30 has been formed, for example to store it or to place it in another reactor. The surface being passivated, the support may be exposed to free air without risk of oxidation.

This support comprises:
a substrate 10 selected from the group consisting of silicon Si, silicon carbide SiC, aluminium nitride AlN, zinc oxide ZnO, sapphire or gallium arsenide GaAs;
a buffer layer 20 including an upper layer based on group III nitrides, which may have for example a thickness comprised between 100 μm and 200 μm;
a crystalline layer 30 of which the thickness may be comprised between 2 and 6 Å, preferably between 2 and 3 Å.

Growth of a Gallium Nitride Layer

The method also comprises a step of growth of a semiconductor structure based on group III nitrides, such as the growth of a gallium nitride layer, on the crystalline layer 30.

The support obtained previously is thus provided, for example by introducing it into the reactor in which the gallium nitride layer is going to grow.

The principle of growth of the gallium nitride GaN layer on the crystalline layer 1×3 is the following.

The deposition of the crystalline layer 1×3 makes it possible to increase the length of diffusion (i.e. amplitude of diffusion characterising the interaction of a neutron with a given isotope) of species deposited on the crystalline layer.

The epitaxial crystalline layer forms a surface energetically unfavourable to the two-dimensional growth of group III nitrides. This anti-surfactant effect induces the formation of islands, the size and the shape of which are determined by the surface energy of the crystalline layer, and by the growth kinetic.

During the step of deposition of the gallium nitride GaN layer, gallium nitride GaN develops laterally from the islands, forming by coalescence a gallium nitride GaN layer (3D growth). The growth of the gallium nitride layer is next continued until a desired thickness of gallium nitride GaN (2D growth) is obtained.

Preferably, the step of growth 300 comprises the growth, on the crystalline layer 30, of a layer based on group III nitrides 40 having a thickness greater than 1 μm, and preferably greater than 2 μm.

A stack of layers is then obtained composed of a substrate, a buffer layer, a crystalline layer and a gallium nitride layer.

Preferably, the step of growth 300 is carried out at a temperature comprised between 950 and 1200° C., and preferably between 1000° C. and 1100° C. Preferably the step of growth is carried out in one go, and thus does not comprise an annealing step.

The threading dislocation density that emerges on the surface may be measured by TEM (Transmission Electron Microscopy). The threading dislocation density is less than or equal to $5.10^8$ cm$^{-2}$. The gallium nitride GaN thus has a reduced threading dislocation density compared to a GaN layer formed according to a method of the prior art, without the crystalline layer 1×3.

It may be noted that the coalescence zone in the gallium nitride layer, at the level of which are observed the dislocations curve, extends over a thickness less than 2 μm from the surface of the crystalline layer 30, as may be noted by an observation by electron microscope.

The coalescence thickness of gallium nitride GaN is defined as the thickness required to obtain an entirely coalesced GaN layer, that is to say having a continuous surface plane. Islands can no longer be distinguished.

Obviously, the gallium nitride GaN layer may next be separated from the substrate and from the buffer layer, for example to obtain a self-supporting gallium nitride GaN layer.

Growth Techniques Used

Advantageously, the steps of:
formation of the buffer layer 20, and/or
deposition of the crystalline layer 30 on the buffer layer 20, may be carried out by an ultra-vacuum deposition, preferably by molecular beam epitaxy (MBE).

It is also possible that the step of deposition of the crystalline layer 30 and/or the buffer layer 20 consists of a vapour phase deposition, more precisely a deposition by metal organic vapour phase epitaxy (MOVPE).

The fact of forming the buffer layer by molecular beam epitaxy—and thus in an ultra-vacuum environment—has numerous advantages compared to techniques of formation of the buffer layer by metal organic vapour phase epitaxy.

Notably, the formation of the buffer layer 20 by molecular beam epitaxy makes it possible:

on the one hand, to eliminate any trace of reactive gas in the environment of the substrate once the buffer layer 20 has been formed, and thus to limit the risks of parasitic nitridation reactions of the surface of the substrate, on the other hand, to limit fouling of the growth reactor and thus to improve the production yield by reducing the frequency of reactor maintenance operations.

Moreover, the formation of the buffer layer 20 by molecular beam epitaxy makes it possible to obtain a surface of the layer based on group III nitrides that is very smooth, thus improving the formation of the crystalline layer 30.

Furthermore, the use of an ultra-vacuum in MBE also makes it possible to carry out an in-situ monitoring—for example by electron diffraction—of the deposition of the crystalline layer. This enables a precise monitoring of the step of deposition of the crystalline layer so as to stop this step when the thickness of the crystalline layer totally covers the surface.

Thus, the method may comprise a step of measuring the coverage level of the crystalline layer 30 by grazing-incidence diffraction of electrons in the direction [1-100] during the step of deposition of the crystalline layer 30 so as to obtain a diffraction image of said crystalline layer 30, wherein the duration of the step of deposition of the crystalline layer is a function of the intensity of at least one fractional order diffraction line of a diffraction image of the crystalline layer obtained by electron diffraction in the crystallographic direction [1-100].

As indicated previously, the diffraction image of the crystalline layer 30 in the direction [1-100] then comprises:

a central line (0, 0) and integer order lines (0, −1) and (0, 1), two fractional order diffraction lines (0, −⅓) and (0, −⅔) between the central line (0, 0) and the integer order line (0, −1), and two fractional order diffraction lines (0, ⅓) and (0, ⅔) between the central line (0, 0) and the integer order line (0, 1).

Preferably, the step of deposition of the crystalline layer 30 is interrupted when the luminous intensity of the intermediate fractional order lines of the diffraction image (in the crystallographic direction [1-100]) is maximal, which corresponds to a complete coverage level of the surface of the layer based on group III nitride by the crystalline layer 30.

This maximum of intensity is easily identifiable. In fact, by using a CCD camera, it suffices to record the intensity profile of one of the fractional order diffraction lines in the direction [1-100] as a function of the deposition time of the passivation layer. Firstly, the fractional order diffraction line appears then its intensity increases during the deposition, to reach a plateau before secondly decreasing and finishing by disappearing. The maximum of intensity is thus detectable by the stability of this intensity, which can last several minutes or several tens of seconds depending on the technique used.

Similarly, the step of growth of the semiconductor structure—such as a gallium nitride layer—may be carried out by a vapour phase deposition such as by MOVPE.

Example of Production Method

An example of method according to the invention will now be described.

The aim here is to produce a thin gallium nitride GaN layer on a silicon Si substrate, the gallium nitride GaN layer having a low threading dislocation density (TDD<$5.10^8$ cm$^{-2}$).

The silicon substrate used has a crystallographic orientation (111).

An aluminium nitride AlN buffer layer is formed on the silicon substrate by molecular beam epitaxy. The formation of the buffer layer is interrupted when the thickness thereof is comprised between 10 and 200 nm.

The step of deposition of the crystalline layer 1×3 is next carried out. A surface treatment of the buffer layer by molecular beam epitaxy is implemented using silicon atoms and molecules of ammonia $NH_3$. This surface treatment leads to the formation of a new well-defined crystalline structure, measurable and identifiable by electron diffraction.

During the deposition of the crystalline layer, the surface is observed by an electron diffraction technique consisting of sending at grazing incidence a beam of monokinetic electrons onto the crystalline layer in the course of formation in order to observe the resulting diffraction figure (in the crystallographic direction [1-100]).

The ordered periodic structure of the crystalline layer 1×3 makes it possible to diffract the electrons and thus to obtain a specific diffraction image.

The duration of the step of deposition of the crystalline layer is a function of the intensity of at least one fractional order diffraction line observed on the diffraction image.

In particular, the step of deposition of the crystalline layer is interrupted when the intensity of at least one of the diffraction lines observed in the diffraction figure is maximal, which is detectable by the stability of this intensity.

The gallium nitride GaN layer is next made to grow. The crystalline layer makes it possible to initiate a 3D mode of growth of gallium nitride GaN. Islands of gallium nitride GaN form at the surface of the crystalline layer. The islands of gallium nitride GaN get bigger and finish by forming a coalesced layer at around 2 μm.

A gallium nitride GaN layer of thickness 2 μm and of threading dislocation density less than $4.10^8$ cm$^{-2}$ is thus obtained.

Examples of layers of gallium nitride obtained by other methods are given for indicative purposes in the following table.

| (Growth technique) | Substrate | Thickness GaN (μm) | Dislocation density (cm-2) | Full width at half maximum (002) (102) |
|---|---|---|---|---|
| Invention (MBE + MOVPE) | Si(111) | 2 (200 nm AlN) | ~4 × 10^8 | 439" 468" |
| OSRAM (MOVPE) | Si(111) | 1.5 (AlN/AlGaN 400 nm) | >8 × 10^8 | 450" 570" |
| IMEC (MOVPE) | Si(111) | 1.7 (AlN/AlGaN 1.5 mm) | ~3 × 10^8 | 533" — |
| Korea PTI (MOVPE) | Si(111) | 1 | ~2 × 10^9 | 700" 1050" |
| Singapore MIT (MOVPE) | Si(111) | 2.2 | ~10^9 | — — |

-continued

| (Growth technique) | Substrate | Thickness GaN (µm) | Dislocation density (cm-2) | Full width at half maximum (002) (102) |
|---|---|---|---|---|
| U. Magdebourg (MOVPE) | Si(111) | >4 | ~1 × 10^9 | — — |
| Univ. Virginia (MOVPE) | 6H-SiC | 8 | ~4 × 10^8 | 240" 300" |
| U. Cambridge (MOVPE) | Sapphire | 3 | ~2 × 10^8 | 185" 325" |
| U. Cambridge (MOVPE) | Sapphire | 12 | ~5 × 10^7 | 175" 170" |
| Univ. Virginia (MOVPE) | Sapphire | 6 | ~3.5 × 10^7 | 205" 221" |
| Lumilog (MOVPE) | Sapphire | 4 | ~5 × 10^8 | 305" 415" |
| Lumilog (MOVPE) | Sapphire | 9 | >8 × 10^7 | 240" 315" |

As may be noted in the above table, existing methods using a silicon substrate for the growth of a gallium nitride layer do not make it possible to obtain a gallium nitride layer of quality equivalent to the method according to the invention.

Furthermore, it may be noted that even if the methods using a sapphire substrate for the growth of a gallium nitride layer make it possible to obtain a gallium nitride layer having a threading dislocation density equivalent to the method according to the invention, the thickness of the epitaxied gallium nitride GaN layers is greater.

Those skilled in the art will have understood that numerous modifications may be made to the method described above without materially going beyond the new teachings described herein.

For example, the steps consisting of forming the buffer layer and depositing the crystalline layer may be carried out by MOVPE. Furthermore, the step of growth of the semiconductor structure based on group III nitrides may be carried out by MBE.

It is possible to obtain a light emitting diode based on group III nitrides, comprising:
a semiconductor structure described previously,
a first contact layer (40) based on gallium nitride arranged on the first semiconductor layer based on group III nitrides,
a second contact layer (50) based on gallium nitride arranged on the first contact layer based on gallium nitride,
an active layer (60) provided with a structure of multiple quantum wells arranged between the first contact layer based on gallium nitride and the second contact layer based on gallium nitride.

It is thus obvious that the examples that have been given are only particular illustrations that are in no way limiting.

The invention claimed is:

1. Method for producing a support for production of a semiconductor structure based on group III nitrides, the method comprising the steps of:
formation of a buffer layer on a substrate, said buffer layer comprising an upper layer based on group III nitrides,
deposition of a crystalline layer on the buffer layer, said crystalline layer being deposited from silicon atoms so as to cover the entire surface of the upper layer based on group III nitrides, said crystalline layer having a triple periodicity of silicon atoms in a crystallographic direction [1-100] such that a diffraction image of said crystalline layer obtained by grazing-incidence diffraction of electrons in the direction [1-100] comprises:
a central line (0, 0) and integer order lines (0, −1) and (0, 1),
two fractional order diffraction lines (0, −⅓) and (0, −⅔) between the central line (0, 0) and the integer order line (0, −1), and
two fractional order diffraction lines (0, ⅓) and (0, ⅔) between the central line (0, 0) and the integer order line (0, 1); and a semiconductor material based on group III nitrides on the crystalline layer, wherein a state of the crystalline layer has a thickness adapted to maximize a luminous intensity of intermediate fractional order lines of a diffraction image in the crystallographic direction [1-100].

2. Method according to claim 1, wherein the crystalline layer has a single periodicity in a crystallographic direction [1-210] such that a diffraction image of said crystalline layer obtained by grazing-incidence diffraction of electrons in the direction [1-210] comprises a central line (0, 0) and integer order lines (0, −1) and (0, 1) without fractional order lines between them.

3. Method according to claim 1, wherein the step of deposition of the crystalline layer is interrupted at an instant corresponding to a maximum of luminous intensity of intermediate fractional order lines of a diffraction image in the crystallographic direction [1-100].

4. Method according to claim 1, wherein the substrate is based on silicon and the step of formation of the buffer layer includes the deposition of an aluminium nitride AlN layer forming the upper surface layer based on group III nitrides.

5. Method according to claim 1, wherein the substrate is based on silicon and the step of formation of the buffer layer includes: deposition of an aluminium nitride AlN layer and deposition of a gallium and aluminium nitride AlGaN layer forming the upper surface layer based on group III nitrides on the aluminium nitride AlN layer.

6. Method according to claim 1, wherein the buffer layer has, at an end of the formation thereof, a thickness comprised between 10 and 200 nm.

7. Method according to claim 1, wherein the step of deposition of the crystalline layer consists of an ultra-vacuum deposition, preferentially a deposition by molecular beam epitaxy.

8. Method according to claim 7, comprising a step of measuring the crystalline layer by grazing-incidence diffraction of electrons in the crystalline plane [1-100] during the step of deposition of the crystalline layer so as to obtain a diffraction image of said crystalline layer, and the duration of the step of deposition of the crystalline layer is a function of an intensity of at least one fractional order diffraction line of the diffraction image of the crystalline layer in a crystallographic direction [1-100].

9. Method according to claim 1, wherein the crystalline layer has a thickness comprised between 2 and 6.ANG.

10. Method according to claim 1, wherein the step of deposition of the crystalline layer consists of a vapour phase deposition.

11. Method according to claim 10, wherein the step of deposition of the crystalline layer consists of a deposition by metal organic vapour phase epitaxy.

12. Method according to claim 1, wherein the crystalline layer is deposited from silicon atoms and ammonia molecules.

13. A semiconductor structure based on group III nitrides, said structure comprising:

a substrate;

a buffer layer on the substrate, the buffer layer comprising an upper layer based on group III nitrides;

a crystalline layer on the buffer layer, said crystalline layer including silicon atoms and covering the entire surface of the upper layer based on group III nitrides of the buffer layer, said crystalline layer having a triple periodicity of silicon atoms in the direction [1-100], such that a diffraction image of said crystalline layer obtained by grazing-incidence diffraction of electrons in the direction [1-100] comprises:

a central line (0, 0) and integer order lines (0, −1) and (0, 1);

two fractional order diffraction lines (0, −⅓) and (0, −⅔) between the central line (0, 0) and the integer order line (0, −1); and two fractional order diffraction lines (0, ⅓) and (0, ⅔) between the central line (0, 0) and the integer order line (0, 1); and a semiconductor material based on group III nitrides on the crystalline layer, wherein a state of the crystalline layer has a thickness adapted to maximize a luminous intensity of intermediate fractional order lines of a diffraction image in the crystallographic direction [1-100].

14. Support according to claim 13, wherein the crystalline layer has a single periodicity in the crystallographic direction [1-210] such that a diffraction image of said crystalline layer obtained by grazing-incidence diffraction of electrons in the direction [1-210] comprises a central line (0, 0) and integer order lines (0, −1) and (0, 1) without fractional order lines between them.

15. Support according to claim 13, wherein the substrate is based on sapphire $Al_2O_3$, silicon Si, silicon on insulator SOI, silicon carbide SiC, aluminium nitride AlN, zinc oxide ZnO or gallium arsenide GaAs.

16. Support according to claim 13, wherein the substrate is based on silicon and the buffer layer comprises an aluminium nitride AlN layer and a gallium and aluminium nitride AlGaN layer on the aluminium nitride AlN layer.

17. Support according to claim 13, wherein the crystalline layer has a thickness comprised between 2.ANG. and 6.ANG.

18. Support according to claim 13, wherein the buffer layer has a thickness comprised between 10 and 200 nm.

19. Method for producing a semiconductor structure based on group III nitrides, comprising the steps of:

supply of a support according to claim 13, growth of a semiconductor structure based on group III nitrides (40) on the crystalline layer.

20. Method according to claim 19, wherein the step of growth is carried out at a temperature comprised between 950 and 1200.degree. C.

21. Method according to claim 19, wherein the step of growth does not comprises an annealing step.

22. Method according to claim 19, wherein the step of growth comprises the growth of a layer based on group III nitrides (40) on the crystalline layer having a thickness greater than 1.mu.m, and preferably greater than 2.mu.m.

23. Method according to claim 19, wherein the step of growth comprises a step of deposition of a gallium nitride GaN layer on the crystalline layer.

24. Method according to claim 19, wherein the step of growth consists of a deposition by metal organic vapour phase epitaxy.

25. Structure according to claim 13, wherein the semiconductor material based on group III nitrides on the crystalline layer comprises a gallium nitride layer.

26. Structure according to claim 25, wherein the gallium nitride GaN has a threading dislocation density less than or equal to 5.10.sup.8 cm.sup.-2.

27. Structure according to claim 26, wherein the semiconductor material based on group III nitrides on the crystalline layer comprises an aluminium based layer.

28. Light emitting diode based on group III nitrides, comprising:

a semiconductor structure according to claim 13, a first contact layer based on gallium nitride arranged on the first semiconductor layer based on group III nitrides, a second contact layer based on gallium nitride arranged on the first contact layer based on gallium nitride, an active layer provided with a structure of multiple quantum wells arranged between the first contact layer based on gallium nitride and the second contact layer based on gallium nitride.

* * * * *